United States Patent [19]

Ohba et al.

[11] 4,084,107
[45] Apr. 11, 1978

[54] CHARGE TRANSFER DEVICE

[75] Inventors: Shinya Ohba, Kokubunji; Masaharu Kubo, Hachioji; Masakazu Aoki, Kokubunji, all of Japan

[73] Assignee: Hitachi, Ltd., Japan

[21] Appl. No.: 750,589

[22] Filed: Dec. 15, 1976

[30] Foreign Application Priority Data

Dec. 19, 1975 Japan ............................. 50-150579

[51] Int. Cl.$^2$ ................... H01L 29/68; G11C 19/28; G11C 11/40; H03K 17/16
[52] U.S. Cl. ............................... 307/221 D; 307/208; 307/221 C; 357/24
[58] Field of Search ................ 307/208, 262, 221 C, 307/221 D, 304; 357/24; 328/165

[56] References Cited

U.S. PATENT DOCUMENTS

| 3,643,106 | 2/1972 | Berwin et al. | 307/221 D X |
| 3,700,981 | 10/1972 | Masuhara et al. | 307/304 X |
| 3,760,202 | 9/1973 | Kosonocky | 357/24 X |
| 3,819,953 | 6/1974 | Puckette et al. | 307/221 D |
| 3,857,045 | 12/1974 | Low et al. | 307/208 |
| 3,903,543 | 9/1975 | Smith | 307/304 X |
| 3,913,077 | 10/1975 | Erb | 307/221 D X |
| 3,983,573 | 9/1976 | Ishihara | 307/221 D X |

OTHER PUBLICATIONS

Radio-Electronics (pub.); pp. 56-57, 8/1973; "State-of-Solid State.".

Primary Examiner—Larry N. Anagnos
Attorney, Agent, or Firm—Craig & Antonelli

[57] ABSTRACT

A charge transfer device is provided with a clock pulse generator circuit driving simultaneously at least two charge transfer arrays, which is divided into at least two blocks arranged so as to confine the at least two lines of charge transfer arrays therebetween.

7 Claims, 8 Drawing Figures

CHARGE TRANSFER DEVICE

BACKGROUND OF THE INVENTION

1. Field of the Invention:

The invention relates to an arrangement or configuration on a semiconductor substrate in the case where a clock pulse generator for charge transfer arrays such as CCDs (Charge Coupled Devices), BBDs (Bucket Brigade Devices), BCDs (Bulk Charge Transfer Devices) or the like are integrated with the charge transfer arrays and fabricated on the same semiconductor substrate as that of the charge transfer arrays.

2. Description of the Prior Art

A charge transfer device comprises a clock pulse generator circuit driving, through conductor lines, one or more charge transfer arrays, such as charge coupled devices as described, e.g. in U.S. Pat. No. 3,700,932, consisting of an input stage, an output stage, and a plurality of transfer stages. A signal entered from the input stage is sequentially shifted through the transfer stages in synchronism with clock pulses, and is detected at the output stage.

In order to put the charge transfer device into practical use, considering easy handling of the device, easy shielding etc., it is desirable to form and integrate the clock pulse generator circuit on the same substrate as that of the charge transfer array.

On the other hand, since the output signal-to-noise ratio decreases extremely on account of an amplitude change of the clock pulses, a change of the frequency characteristic of the charge transfer array, etc., when the clock frequency of the charge transfer device changes, a differential method, in which charge transfer arrays consisting of two lines are driven so as to compensate for noise, has been proposed. The method is based on the fact that, when the charge transfer arrays are driven by the same clock pulses and the difference between two output signals is formed, in-phase noises can be compensated.

When a clock pulse generator circuit for the charge transfer arrays based on the differential method is to be integrated on the same substrate as that of the charge transfer arrays, the clock pulse generator circuit can be arranged either in the vertical direction or in the horizontal direction with respect to the charge transfer arrays. However, the arrangement in which the clock pulse generator circuit is disposed in the horizontal direction is better than the arrangement in which the clock pulse circuit is disposed in the vertical direction in light of the purpose of the differential method, because it is apparent that the former can reduce noises more than the latter.

Even in the case of the latter, however, there are the problems mentioned below.

(1) The charge transfer array itself is an elongated device. When the clock pulse generator circuit is further provided in the horizontal direction, the shape of a chip becomes more elongated, and chip attachment, package etc. becomes costly.

(2) The number of intersections between pulse lines and intersections between input signal lines and the pulse lines are large, so that noises are large. In addition, noises enter asymmetrically with respect to the pulse waveform, so that the effect of the differential method diminishes.

(3) The charge transfer device is a capacitive load (50 – 200 pF per phase), and a power of about 0.4 – 1 W is consumed in the entire clock pulse circuit to drive the charge transfer arrays at high speed ($\sim$ 10 MHz). When such clock pulse generator circuit is formed as one unit, the temperature rise in the vicinity of the clock pulse generator circuit is large, the current of a MOS transistor constituting the clock pulse circuit decreases, the conductance is lowered, and the performance of the clock pulse circuit is degraded.

(4) Even when the clock pulse generator circuit is carefully designed, the thermal distribution becomes asymmetric, and temperature increases of the charge transfer arrays differ. This induces asymmetry in the leakage current, and results in increasing noises.

SUMMARY OF THE INVENTION

An object of the present invention is, therefore, to provide a charge transfer device having a low noise level, in which the above-mentioned drawbacks of the conventional device are removed.

In order to achieve this object, the charge transfer device according to the invention is provided with a clock pulse generator circuit driving simultaneously at least two charge transfer arrays, which is divided into at least two blocks arranged so as to confine at least two charge transfer arrays therebetween.

Hereinbelow, this invention will be described more in detail in connection with some preferred embodiments with reference to the accompanying drawing. It is a matter of course, however, that various modifications and improvements can be made without departing from the scope of this invention.

DETAILED DESCRIPTION OF THE PRIOR ART

Figure 1:
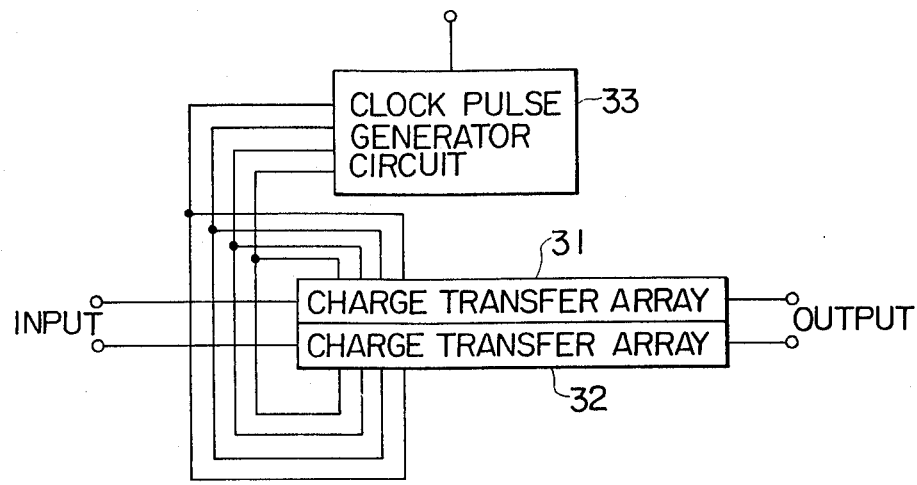
FIGS. 1 and 2 are block diagrams of conventional charge transfer devices.
Figure 2:
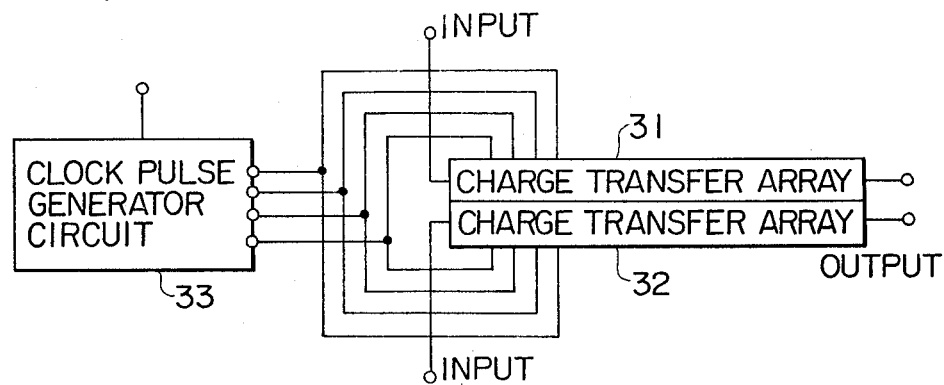

In order to facilitate a better understanding of advantages of this invention, block diagrams of conventional charge transfer devices are shown in FIGS. 1 and 2, in which a clock pulse generator circuit 33 is arranged in the vertical and horizontal direction with respect to the charge transfer arrays 31 and 32, respectively. It is evident that these devices have the drawbacks previously mentioned. It should be noted that, in the device shown in FIG. 2, there are 6 intersections between pulse lines and 8 intersections between input signal lines and the pulse lines.

DETAILED DESCRIPTION OF THE INVENTION

Figure 3:
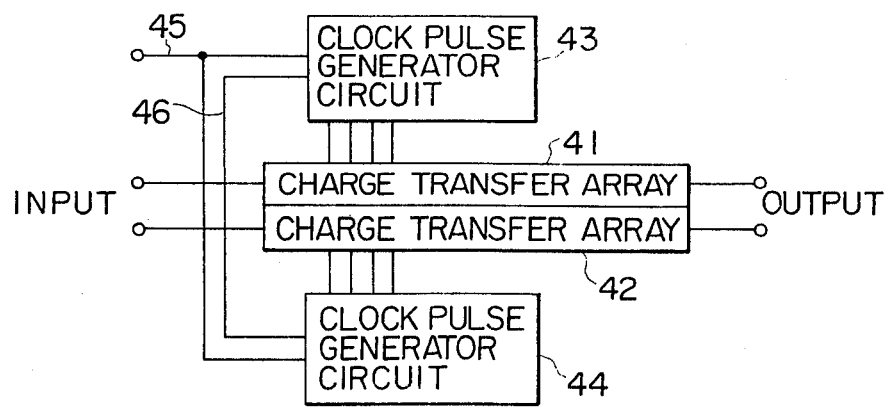
FIGS. 3 and 4 are block diagrams of charge transfer devices according to the invention.

FIG. 3 is a diagram showing an embodiment of the invention, in which two clock pulse generator circuits 43, 44 are provided above and below two charge transfer arrays, such as charge coupled devices, arranged in parallel with each other 41, 42 of the differential type. In the figure, reference numeral 45 designates a conductor line for master pulses for control from the exterior. Four-phase pulse groups of the same waveform are formed in the clock pulse generator circuits 43,44 by the master pulses. Where the system of the clock pulse generator circuits 43,44 is the frequency-division-by-2 system or the frequency-division-by-4 system, one more conductor line 46 for setting the initial value is required. Comparing this device with that indicated in FIG. 2, it will be understood that the device according to the invention has the following advantages:

(1) The number of the intersections between the input signal lines and the pulse system decreases from eight to four. Moreover, in FIG. 3, the intersections are only those of the signal input lines with the master pulse line and the initial value setting line, which have small amplitudes and small currents. Noises become still smaller than those obtained by the device illustrated in FIG. 2.

(2) There are no intersections between the signal input lines and the clock pulse lines in the device according to the invention.

(3) The shape of the entire device is close to that of a square, and the device can be installed in an inexpensive package such as a TO-5.

(4) The power consumption of each of the clock pulse generator circuits 43,44 becomes a half of that of the clock pulse generator circuit of the device shown in FIG. 2, and the temperature increase component is below ½ owing to the presence of a synergetic effect. Accordingly, the conductance of the MOS transistor becomes higher than that of the device indicated in FIG. 2.

(5) The charge transfer arrays 41,42 are equally distant from the clock pulse generator circuits 43,44 which are heat generating sources. Therefore, a thermal balance between the two charge transfer arrays is easily obtained. Consequently, the leakage currents susceptible to temperature become substantially equal, and noises in the case of adopting the differential type become small.

(6) The length of the pulse line through which a large current flows and the area which is defined by the pulse lines are smaller than those in the device indicated in FIG. 2. Therefore, the generation of electromagnetic waves is decreased, and the radiation energy of jamming electric waves to outside the package of the charge transfer device is lowered.

Figure 4:
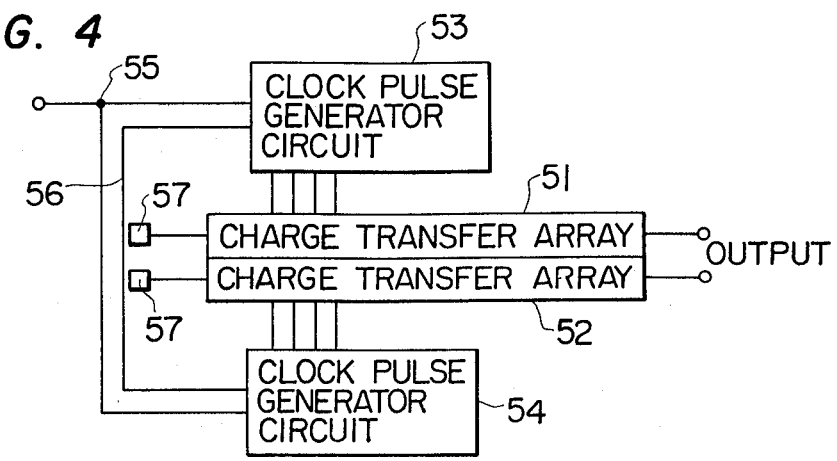

(7) In order that the noises ascribable to the intersections between the pulse lines and the input signal lines may be restrained from entering the input signals as far as possible, an arrangement shown in FIG. 4 according to the invention makes it possible to provide bonding pads 57 for the input lines in an area bounded by the initial value setting line 56 and the clock pulse lines. In contrast, in the device indicated in FIG. 2, the pads lie between the clock pulse generator circuit 33 and the charge transfer arrays 31,32, and practical bonding is very difficult.

Figure 5:
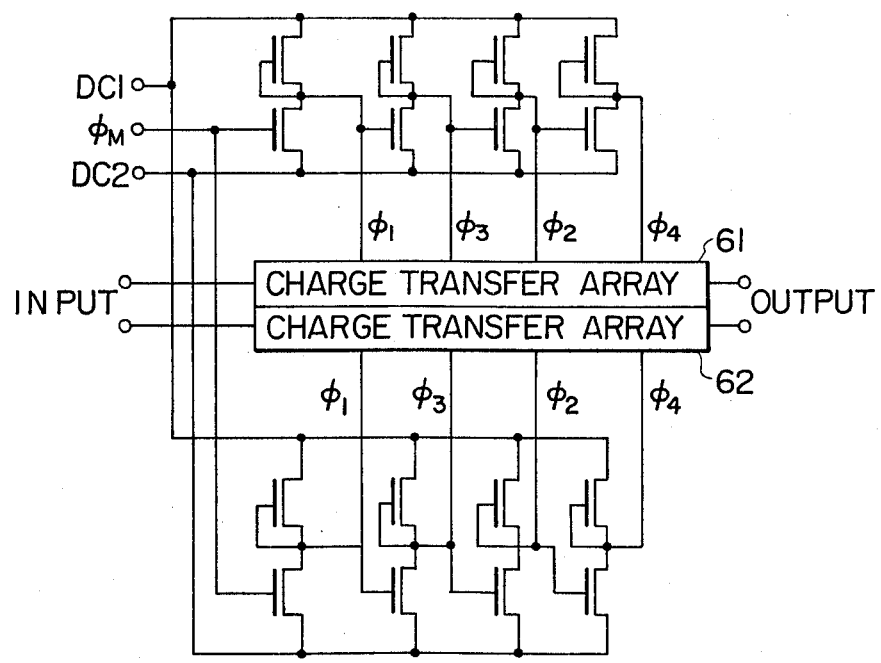
FIG. 5 is a circuit diagram of a clock pulse generator circuit in the charge transfer device shown in FIG. 3.
Figure 6:
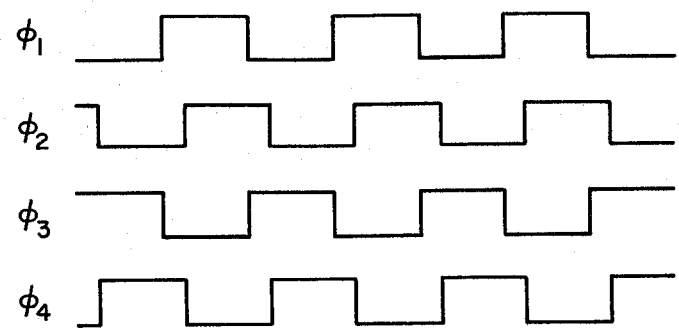
FIG. 6 shows waveforms of the pulses driving the circuit shown in FIG. 5.

An example of a concrete circuit is illustrated in FIG. 5. The circuit indicated in FIG. 5 is so constructed that a master pulse $\phi_M$ of small amplitude ($\sim 5$ V$_{pp}$) is amplified by E/D inverters so as to form clock pulses for the charge transfer arrays 61,62. The waveform of the pulses $\phi_1 \sim \phi_4$ is shown in FIG. 6. DC1 and DC2 designate direct current sources.

In FIG. 5, the number of the intersections between input lines of the charge transfer arrays 61,62 and the master pulse line is two. Although each of the input lines further intersects with two lines, noises are not created because these two lines are d.c. power supply lines. FIG. 5 shows a concrete example of the embodiment of the device shown in FIG. 3 from which the initial value setting line 46 is removed.

Figure 7:
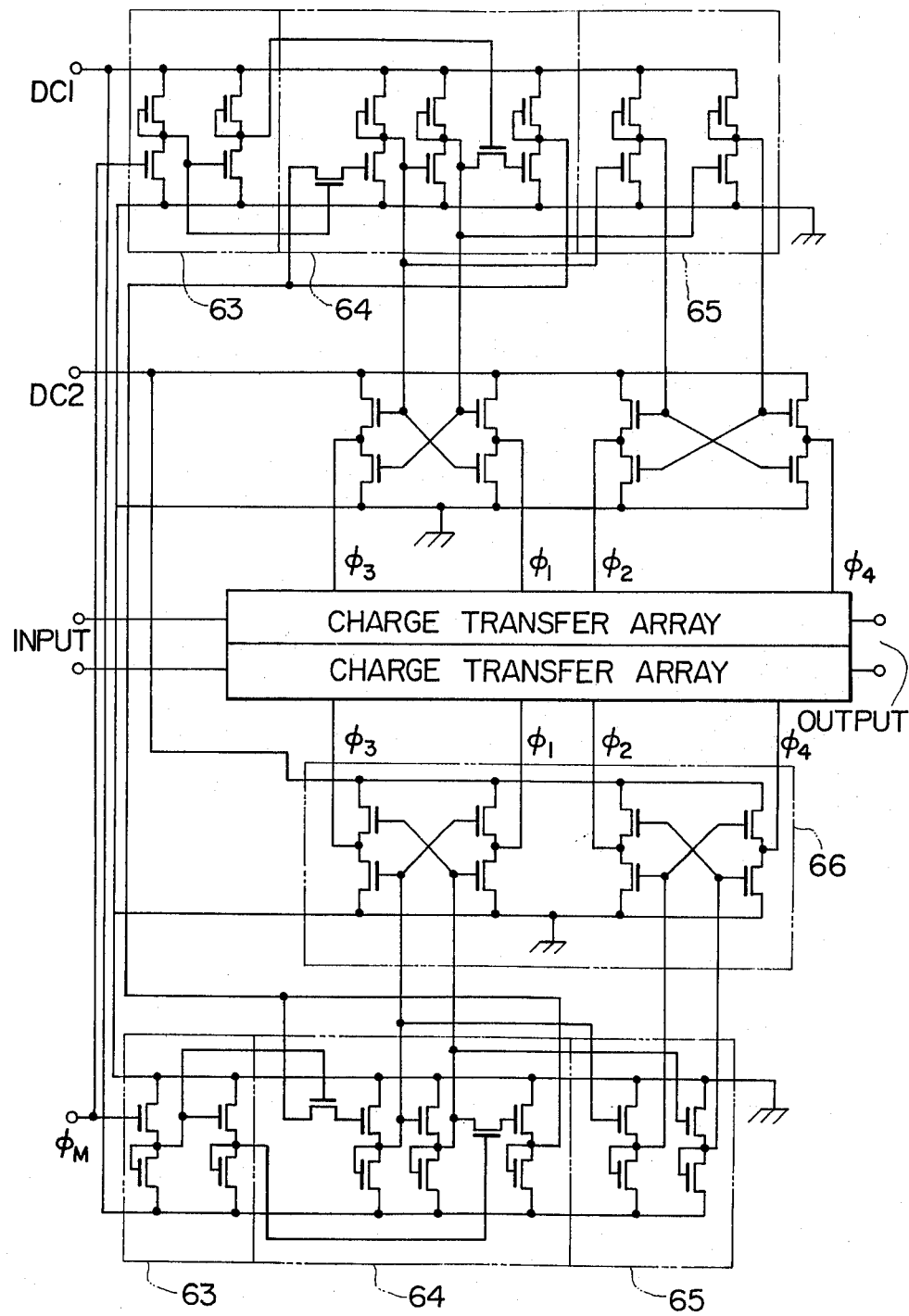
FIG. 7 is a circuit diagram of another clock pulse generator circuit in the charge transfer device shown in FIG. 5.

FIG. 7 shows another example of the clock pulse generator circuit according to the invention. Each block of the circuit consists of a pulse forming circuit 63, a shift register 64, delay circuits 65, and push-pull buffers 66. The shift register 64, consisting of inverter circuits connected one after another, divides the master pulse frequency by 2 and generates pulses with a 50% duty ratio. The delay circuits 65 introduce a slight delay between $\phi_1$ and $\phi_2$, and $\phi_3$ and $\phi_4$ in four phases, utilizing the delay time of the inverter circuits.

Figure 8:
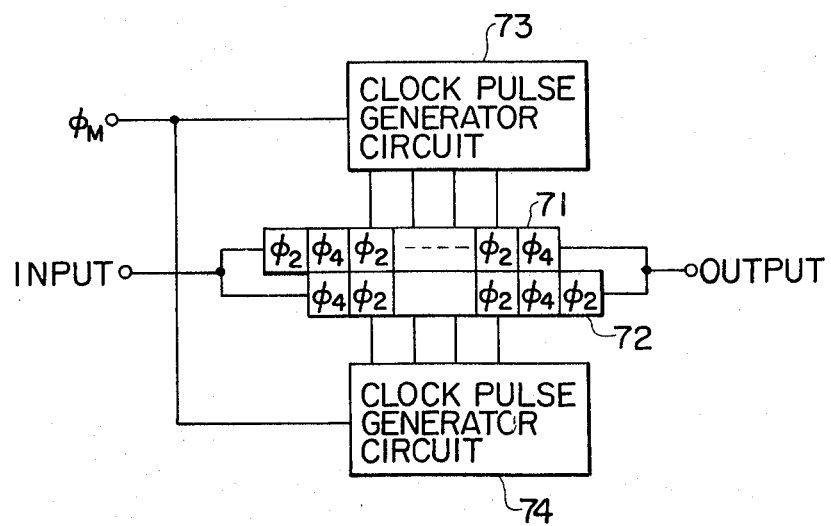
FIG. 8 is a block diagram of another charge transfer device according to the invention.

Although the above explanation has been made only for the case of driving the two charge transfer arrays by the differential system, the invention is not restricted thereto. By way of example, there is another well-known method for driving the charge transfer device, the so-called series-parallel system. As is illustrated in FIG. 8, this system is so constructed that one of two charge transfer arrays 71,72 has the transfer of signal charges initiated from storage pulse $\phi_2$ and terminated at $\phi_4$ and that conversely the other has the same initiated from the pulse $\phi_4$ and terminated at $\phi_2$. The phases of the two charge transfer arrays are shifted by just 180°. Reference numerals 73 and 74 indicate clock pulse generator circuits. The driving method has the advantage that the signal sampling frequency becomes twice as high as the clock pulse frequency and that the band width of signals to be transmitted is doubled.

Although the invention is described in connection with some embodiments which relate to a charge coupled device, it is evident that it can be applicable to various charge transfer devices, such as a bucket brigade device and a bulk charge transfer device, and further devices similar thereto. The number of clock pulse phases may be any of two and more, although only a device of four-phase drive is described in the embodiments for the sake of simplicity.

What is claimed is:

1. A charge transfer device comprising:
   a semiconductor substrate;
   at least two arrays of charge transfer devices disposed on said semiconductor substrate;
   a clock pulse generator circuit disposed on said semiconductor substrate and driving simultaneously said at least two arrays of charge transfer devices, said clock pulse generator circuit being divided into at least two blocks arranged on said substrate so as to confine said at least two arrays of charge transfer devices therebetween; and
   a conductor line for supplying master clock pulses for externally controlling said at least two blocks of said clock pulse generator.

2. A charge transfer device according to claim 1, further comprising a conductor line for setting the initial value, said conductor line connecting said at least two blocks and being disposed on said substrate so as not to intersect with said conductor line for master clock pulses.

3. A charge transfer device according to claim 2, further comprising at least two input lines on said substrate each input line intersecting said conductor line for master clock pulses and said conductor line for setting an initial value.

4. A charge transfer device according to claim 2, further comprising at least two bonding pads for input pulses disposed in an area of said substrate bounded by said conductor line for setting an initial value and conductor lines connecting each of said at least two blocks with one of said at least two arrays of charge transfer devices, said bonding pads being connected electrically with one of said at least two arrays of charge transfer devices so as not to intersect any of said conductor lines.

5. A charge transfer device according to claim 1, in which each block of said clock pulse generator circuit consists of a pulse-forming circuit, a shift register connected to said pulse-forming circuit, delay circuits connected to respective stages of said shift registers and push-pull buffers connected to said respective stages of said shift register and said delay circuits for generating four-phase clock pulses, said shift register consisting of a plurality of inverter circuits connected one after another so as to divide the master clock pulse frequency by two and to generate pulses with a 50% duty ratio, said delay circuits introducing a slight delay in four phases, utilizing the delay time of the inverter circuits.

6. A charge transfer device according to claim 1, further comprising an input line connected in common to one end of each of said arrays, and an output line connected in common to the other end of each of said arrays, said arrays being displaced relative to one another so that the clock pulse applied to the first stage of one array is applied to the last stage of the adjacent array and clock pulses applied to the first stage of each respective array are shifted in time relative to each other by 180°.

7. A charge transfer device according to claim 1, wherein each block of said clock pulse generator circuit comprises a plurality of inverter circuit stages, made of an enhancement/depletion-connected field effect transistor, connected in cascade, each block receiving said master clock pulses and generating plural clock pulses shifted in time with respect to each other from said inverter circuit stages.

* * * * *